(12) United States Patent
Chan et al.

(10) Patent No.: US 7,736,967 B2
(45) Date of Patent: Jun. 15, 2010

(54) METHOD AND STRUCTURE OF AN ONE TIME PROGRAMMABLE MEMORY DEVICE IN AN EMBEDDED EEPROM

(75) Inventors: YiPeng Chan, Shanghai (CN); ShengHe Huang, Shanghai (CN); Jing Lu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 564 days.

(21) Appl. No.: 11/502,129

(22) Filed: Aug. 9, 2006
(Under 37 CFR 1.47)

(65) Prior Publication Data
US 2007/0132002 A1 Jun. 14, 2007

Related U.S. Application Data

(63) Continuation of application No. 11/246,404, filed on Oct. 6, 2005, now abandoned.

(30) Foreign Application Priority Data
Sep. 28, 2005 (CN) .................. 2005 1 0030303

(51) Int. Cl.
H01L 21/8238 (2006.01)
(52) U.S. Cl. .................. 438/211; 438/257; 257/315; 257/E21.68
(58) Field of Classification Search .................. 438/211, 438/257, 263, 264; 257/315, E21.68, E21.681
See application file for complete search history.

(56) References Cited

U.S. PATENT DOCUMENTS 6,287,907 B1 * 9/2001 Ito et al. .................. 438/201
6,417,044 B1 * 7/2002 Ono .................. 438/241

OTHER PUBLICATIONS

Hashim and Ayub, "Ono and Tunnel Oxide Characterization and optimization for high speed EEPROM device", Jurnal Teknologi, 38(D), 2003, pp. 125-136.*
Becker et al. "Process and film characterization of low pressure tetraethylorthosilicoate-borophoshosilicate glass", J.Vac.Sci.Techol. B 4 (3), 1886, pp. 732-744.*

* cited by examiner

Primary Examiner—Asok K Sarkar
Assistant Examiner—Julia Slutsker
(74) Attorney, Agent, or Firm—Townsend and Townsend and Crew LLP (57) ABSTRACT

A structure and a manufacturing method for an OTP-EPROM in an embedded EEPROM integrated circuit structure. The structure has a substrate that includes a surface region. The structure has a gate dielectric is overlying the surface region. The structure also a first OTP-EPROM gate overlying the gate dielectric layer in a first cell region, and an EEPROM floating gate and a select gate overlying the gate dielectric layer in a second cell region. An insulating layer is overlying the first OTP-EPROM gate, the EEPROM floating gate and the select gate. An OTP-EPROM control gate is overlying the insulating layer and coupled to the first OTP-EPROM gate. An EEPROM control gate is overlying the insulating layer and coupled to the EEPROM floating gate.

14 Claims, 13 Drawing Sheets

METHOD AND STRUCTURE OF AN ONE TIME PROGRAMMABLE MEMORY DEVICE IN AN EMBEDDED EEPROM

BACKGROUND OF THE INVENTION

The present invention relates to an integrated circuit that employs a combination of multiple non volatile memory cell structures. More particularly the present invention relates to a highly integrated circuit and a fabrication method for an one time programmable (OTP) memory integrated device in an embedded EEPROM array. Merely by way of example, the invention has been applied to an one time programmable erasable programmable read only memory (OTP EPROM) device in an embedded EEPROM array. But it would be recognize that the invention has a much broader applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of dollars. Each fabrication facility will have a certain throughput of wafers, and each wafer will have a certain number of integrated circuits on it. Therefore, by making the individual devices of an integrated circuit smaller and integrating more functions on a single chip, more devices may be fabricated on each wafer, thus increasing the output of the fabrication facility. Making devices smaller and integrating device function on a single chip is very challenging, as each process used in integrated device fabrication has a limit. That is to say, a given process typically only works down to a certain feature size and for certain device structure, and then either the process or the device layout needs to be changed.

As an example in digital systems, various types of memory devices have been proposed. Such memory devices include, among others, read only memory, commonly called ROM devices. The read only memory (ROM) device such as a mask ROM can be used in code storage on portions of the array of memory units. As merely an example, conventional mask ROM often includes a program photo mask set be used to input the codes in manufacturing process. Although such mask ROMs have been successful, conventional mask ROMs have certain limitations. That is, such conventional mask ROMs often suffer from a long coding lead time and inflexibility. The result is higher manufacturing cost.

From the above, it is seen that an improved and cost effective method for fabricating semiconductor devices including memory devices is desired.

BRIEF SUMMARY OF THE INVENTION

According to the present invention, techniques for processing integrated circuits for manufacturing of semiconductor devices are provided. More particularly, the invention provides a method for manufacturing an one time programmable (OTP) EPROM in an embedded EEPROM array and a resulting device having a reduced dimension. But it would be recognize that the present invention has a much broader range of applicability.

In a specific embodiment, the invention provides a method for forming an OTP gate structure in an embedded EEPROM array. The method includes providing a substrate including a surface region. The surface region is provided with a first cell region and a second cell region. The method includes forming a gate dielectric layer of a first thickness overlying the surface region. A tunnel oxide window is formed in a portion of the second cell region. The tunnel oxide window is characterized by a second thickness which is less than the first thickness. A first OTP gate associated with an OTP gate structure is formed overlying the gate dielectric in the first cell region. Simultaneously, an EEPROM floating gate and a select gate associated with an EEPROM gate structure are formed overlying the gate dielectric layer in the second cell region. The EEPROM floating gate is formed overlying the portion of the second cell region that comprises the tunnel oxide window. The first OTP gate, the EEPROM floating gate and the select gate are formed using a first polysilicon layer.

The method also includes masking the second cell region that comprises the EEPROM floating gate and the select gate using a patterned mask and exposing the first cell region associated with the OTP gate structure. Preferably, the patterned mask is made of a photoresist material, other patterned masks such as a hard mask or silicon oxide or silicon nitride or others can also be used. An OTP source region and an OTP drain region are formed in a portion of the substrate in the first cell region while the second cell region is masked. The OTP source region and the OTP drain region are formed using implantation. The method includes forming an insulating layer overlying the first OTP gate, the EEPROM floating gate, and the select gate. The insulating layer comprises of a dielectric material such as ONO, other dielectric materials may also be used.

The method also includes forming an OTP control gate overlying the insulating layer and coupled to the first OTP gate, an EEPROM control gate overlying the insulating layer and coupled to the EEPROM floating gate, and a removable second select gate overlying the insulating layer overlying the select gate, using a second polysilicon layer. The removable second gate is removed. A dielectric layer is formed overlying the OTP gate structure, the EEPROM gate structure and the EEPROM select gate.

In an alternative embodiment, the invention provides a structure for an OTP EPROM in an embedded EEPROM array integrated circuit. The structure has a substrate that includes a surface region. The surface region is provided with a first cell region and a second cell region. The structure also has a gate dielectric layer of a first thickness overlying the surface region of the substrate.

The structure has a first OTP EPROM gate overlying the dielectric layer in the first cell region. An EEPROM floating gate and a select gate are overlying the dielectric layer in the second cell region. The EEPROM floating gate is overlying a portion of the second cell region that comprises a tunnel oxide window. The tunnel oxide has a second thickness which is less than the first thickness. An insulating layer is overlying the first OTP EPROM gate, the EEPROM floating gate and the select gate. The structure also has a control gate overlying the insulating layer and coupled to the floating gate of the EEPROM and a control gate overlying the insulating layer and coupled to the first OTP gate. The resulting OTP EPROM is about 15-30% of the size of the EEPROM Many benefits are achieved by way of the present invention over conventional EEPROM and masked ROM. For example, the resulting OTP EPROM has a reduced cell size that is about 0.8-1.2 $\mu m^2$ and less and the EEPROM has a cell size of about 3-6 $\mu m^2$ and less, using a 0.18 $\mu m$ technology node. The present invention also provides the benefit of an embedded OTP device that eliminates the long lead time in coding as required in a masked ROM. Additionally, the method provides a process that is compatible with conventional process technology without substantial modification to convention equipment and process. Depending upon the embodiment, one or more of the these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

The features and advantages of the present invention will be illustrated by the following figures.

DETAILED DESCRIPTION OF THE INVENTION

The present invention provides a fabrication method for a one time programmable (OTP) memory device in an embedded EEPROM array. In particular, the invention provides a method and resulting device for manufacturing a OTP EPROM device structure in an embedded EEPROM array. But it would be recognized that the invention has a much broader range of applicability.

A method for fabricating a OTP EPROM device in an embedded EEPROM array according to the present invention may be outlined as follows:

1. Provide a semiconductor substrate including a surface region;
2. Provide a first cell region and a second cell region;
3. Form a gate dielectric layer of a first thickness overlying the surface region of the substrate;
4. Form a tunnel oxide window of a second thickness in a portion of the second cell region;
5. Form a first OTP EPROM gate associated with an OTP EPROM gate structure overlying the gate dielectric layer in the first cell region, a floating gate and a select gate associated with an EEPROM overlying the gate dielectric layer in the second cell region using a first polysilicon layer, the floating gate associated with EEPROM is overlying the portion of the second cell region that comprises the tunnel oxide window;
6. Mask the second cell region associated with the EEPROM using a photoresist material and exposing the first cell region. Form a source region and a drain region for the OTP EPROM gate structure in the substrate in the first cell region while the second cell region is being masked;
7. Form an insulating layer overlying the first OTP EPROM gate, the EEPROM floating gate, and the EEPROM select gate, the insulating layer is a dielectric material such as ONO, other dielectric materials can also be used;
8. Form an OTP EPROM control gate, an EEPROM control gate and a removable second select gate overlying the insulating layer using a second polysilicon layer;
9. Remove the removable second select gate;
10. Form a dielectric layer overlying the OTP EPROM gate structure, the EEPROM gate structure and the EEPROM select gate; and
11. Perform other necessary steps such as deposition and planarization of interlayer dielectric (ILD), deposition and patterning of metal layers, among others.

The above sequence of steps provides a method for forming an integrated circuit memory device according to an embodiment of the present invention. As shown, the method uses a combination of steps including a way of forming a one time programmable memory device and a EEPROM device. In a preferred embodiment, the method forms a one time programmable EPROM device and an array of EEPROM devices using a similar process sequence. Other alternatives can also be provided where steps are added, one or more steps are removed, or one or more steps are provided in a different sequence without departing from the scope of the claims herein. Further details of the present method can be found throughout the present specification and more particularly with reference to the figures below.

FIGS. 1-9 illustrate simplified diagrams of providing a method for forming a one time programmable memory (OTP) device EPROM in an embedded EEPROM array according to embodiments of the present invention. These diagrams are merely examples, which should not unduly limit the scope of the claims herein. One of ordinary skill in the art would recognize other variations, modifications, and alternatives.

Figure 1:
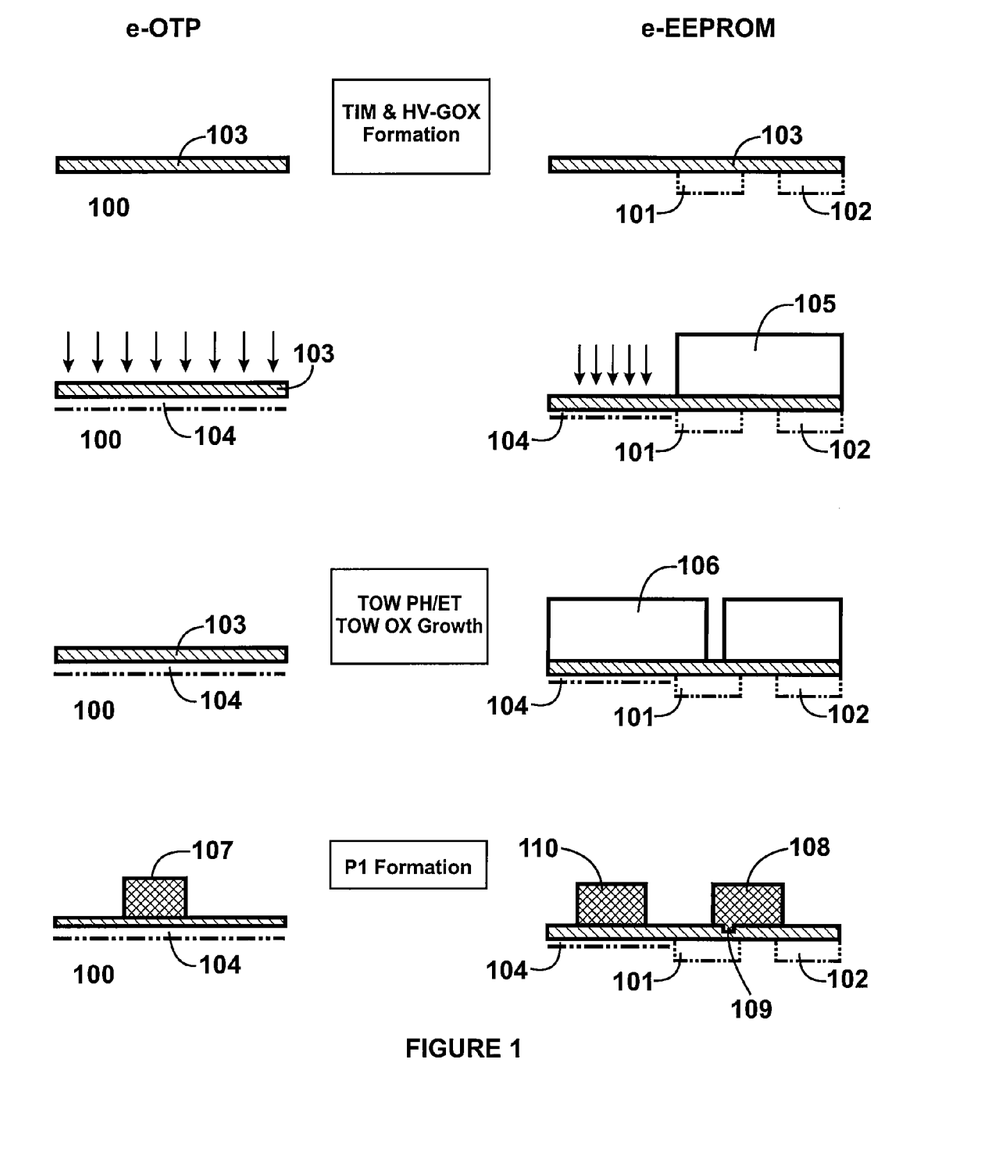
FIGS. 1-9 illustrate simplified diagrams providing a method for forming an OTP EPROM and embedded EEPROM array according to embodiments of the present invention.

As shown in FIG. 1, the method begins by providing a substrate 100 including a surface region. The surface region provides a first cell region for a one time programmable (e-OTP) memory device and a second cell region for an embedded EEPROM (e-EEPROM) integrated circuit. The substrate is often a p-type silicon wafer. Other suitable substrate such as silicon on insulator (SOI) or an epitaxial silicon can also be used. Additionally, a silicon wafer of a different impurity can also be used depending on the application.

A source region 101 and a drain region 102 for the embedded EEPROM in the second cell region are also shown. The source region and the drain region are formed by implantation of a n-type impurity such as arsenic at an energy of about 15 keV to 100 keV. The angle of implantation is often at 0 degrees off normal. Other implant parameters can also be used.

The method also includes forming a gate dielectric layer 103 of a first thickness overlying the surface region including the first and second cell regions. The gate dielectric is often a dense silicon dioxide such as thermal oxide or a silicon oxynitride or a silicon nitride depending on the application. As an example, the gate dielectric comprises of silicon dioxide having a thickness ranging from 70 to 120 Angstroms. Depending upon the embodiment, there can also be other variations.

The method includes forming a shallow implant 104 in the substrate in a portion of the first cell region and a portion of the second cell region. The portion of the second cell region includes a select gate for an embedded EEPROM. A patterned mask 105 is formed overlying other portion of the second cell region. The shallow implant serves as an adjustment for threshold voltage.

A tunnel oxide window region 109 associated with the embedded EEPROM is shown. The tunnel oxide window is provided for programming the embedded EEPROM using Fowler Nordheim tunneling. The method includes patterning the gate dielectric layer using a photomask 106. The tunnel oxide window is characterized by a second thickness. The second thickness is less that the first thickness of the gate dielectric. Preferably, a phase shift mask is used The resulting tunnel oxide window has a width of about 0.20 to about 0.55 microns.

Also shown in FIG. 1, a first polysilicon layer is formed overlying the gate dielectric layer. The first polysilicon is often doped in situ during deposition with a dopant such as phosphorus at a dosage ranging from $10^{19}$ to $10^{21}$ atom/cm$^3$. Depending upon the application, other dopant materials such as boron, arsenic or antimony may also be used. The first polysilicon may also be doped after deposition. The method also includes patterning the first polysilicon layer to form a floating gate 108 and a select gate 110 for the embedded EEPROM, and a first gate 107 for the OTP EPROM. The floating gate 108 has a width ranging from about 0.6 to about 0.8 microns and a length ranging from about 0.35 to 0.60 microns at 0.25 micron or 0.18 micron technology nodes. Of course, one of ordinary skill in the art would recognize that the length and the width of the floating gate can further be shrunk at a more advanced technology node.

Figure 2:
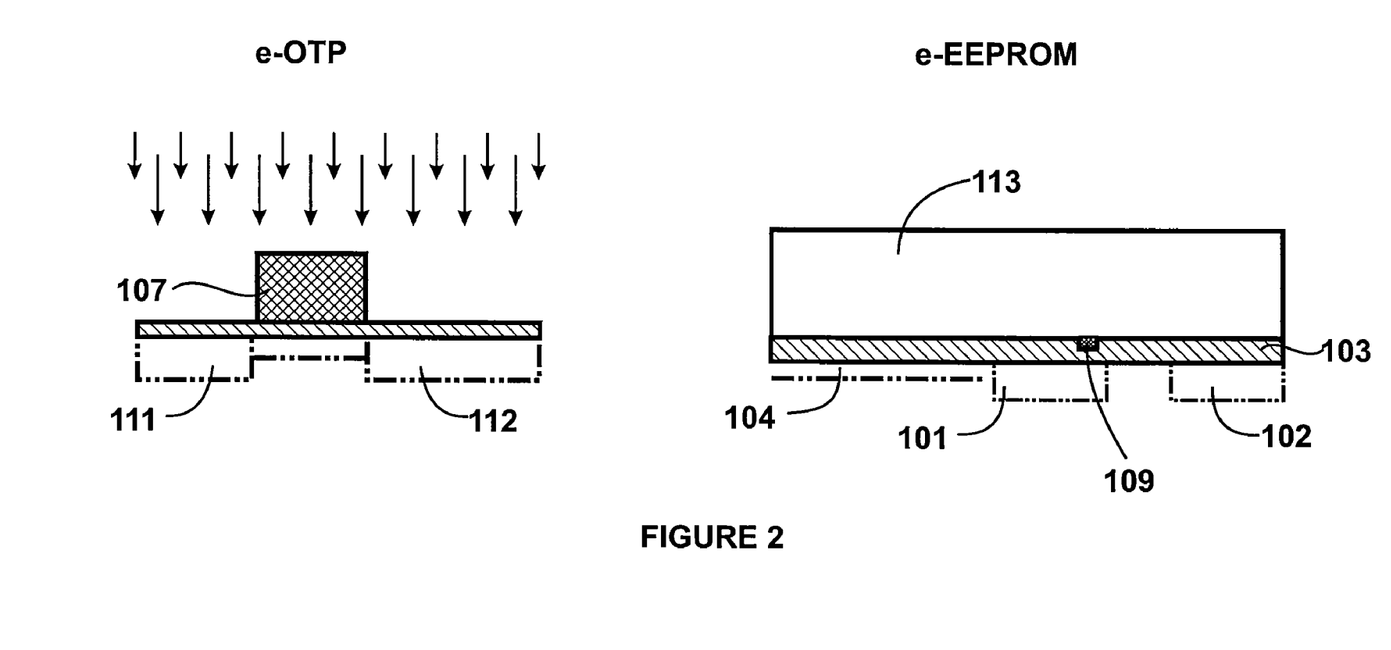

FIG. 2 illustrate the steps in forming a source region 111 and a drain region 112 associate with the OTP EPROM in the first cell region according to an embodiment of present invention. The method includes masking the second cell region associated with the embedded EEPROM with a masking layer 113 while the first cell region associated with the OTP EPROM is exposed. Preferably a photoresist is used as the masking material, other materials such as a hard mask or silicon oxide or a silicon nitride or a combination can also be used. The source region 111 and the drain region 112 associated with the OTP EPROM are formed using implantation. As merely as an example, the source region and the drain region for the OTP EPROM are formed using implantation of a n type impurities such as arsenic. The implantation is provided at an energy ranging from 10 to 60 keV and a dose ranging form $1\times10^{15}$ to $5\times10^{15}$ atoms cm$^{-3}$. Alternatively, other suitable implant parameters may also be used depending on the application. Like reference numerals are used in FIG. 2 as some of the other Figures herein.

In a specific embodiment, the method also includes implantation of a channel region of an OTP-EPROM with a p type impurity such as boron. The channel region is defined between the source region and the drain region of the OTP-EPROM. The channel region implant provides a threshold voltage suitable for programming of the OTP-EPROM. Alternatively, the OTP EPROM channel implant may also be performed before forming the first gate 107.

Figure 3:
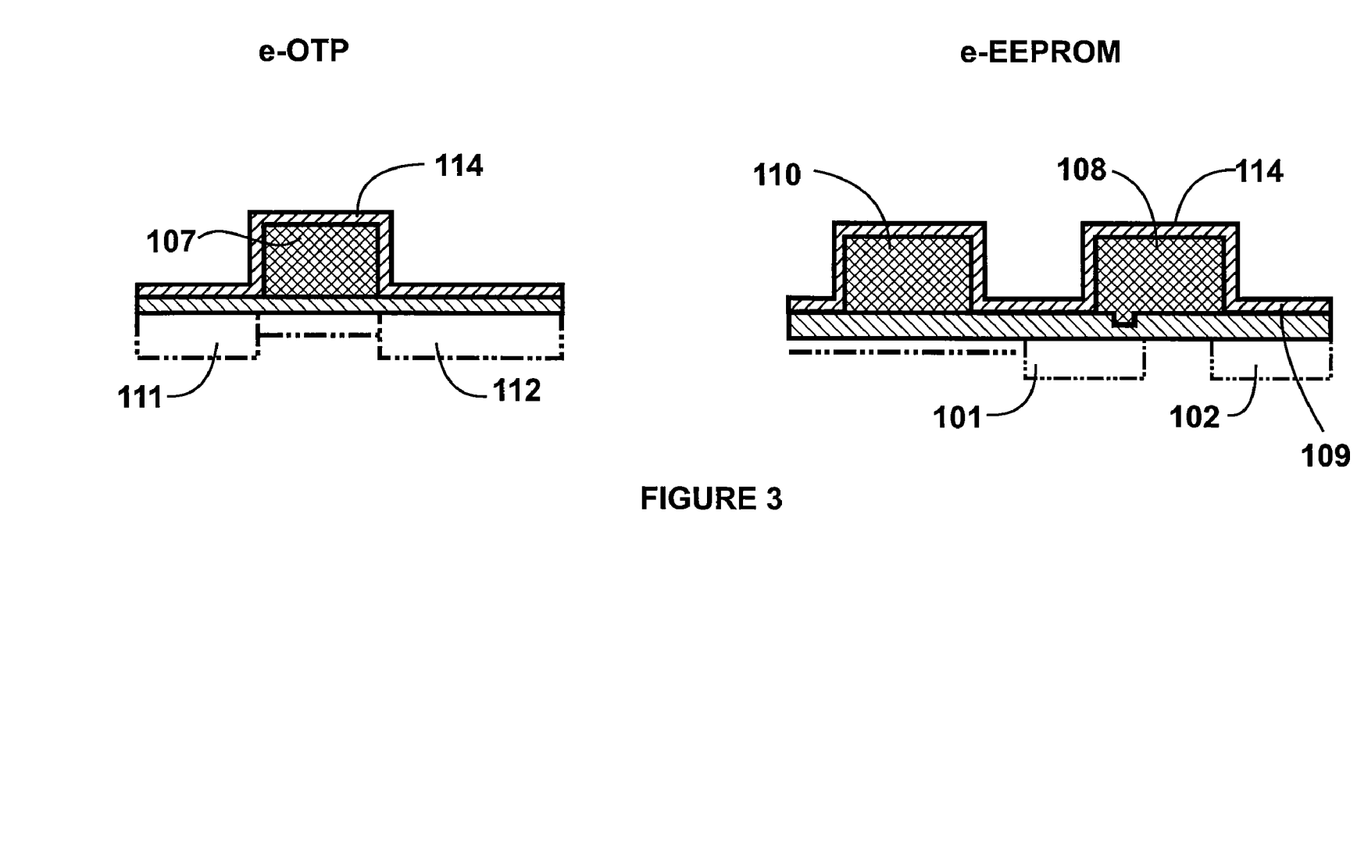

FIG. 3 shows the formation of an insulating layer 114 overlying the first polysilicon layer. The insulating layer is preferably an oxide on nitride on oxide structure commonly refers to ONO. Other insulating materials may also be used. Like reference numerals are used in FIG. 3 as some of the other Figures herein.

Figure 4:
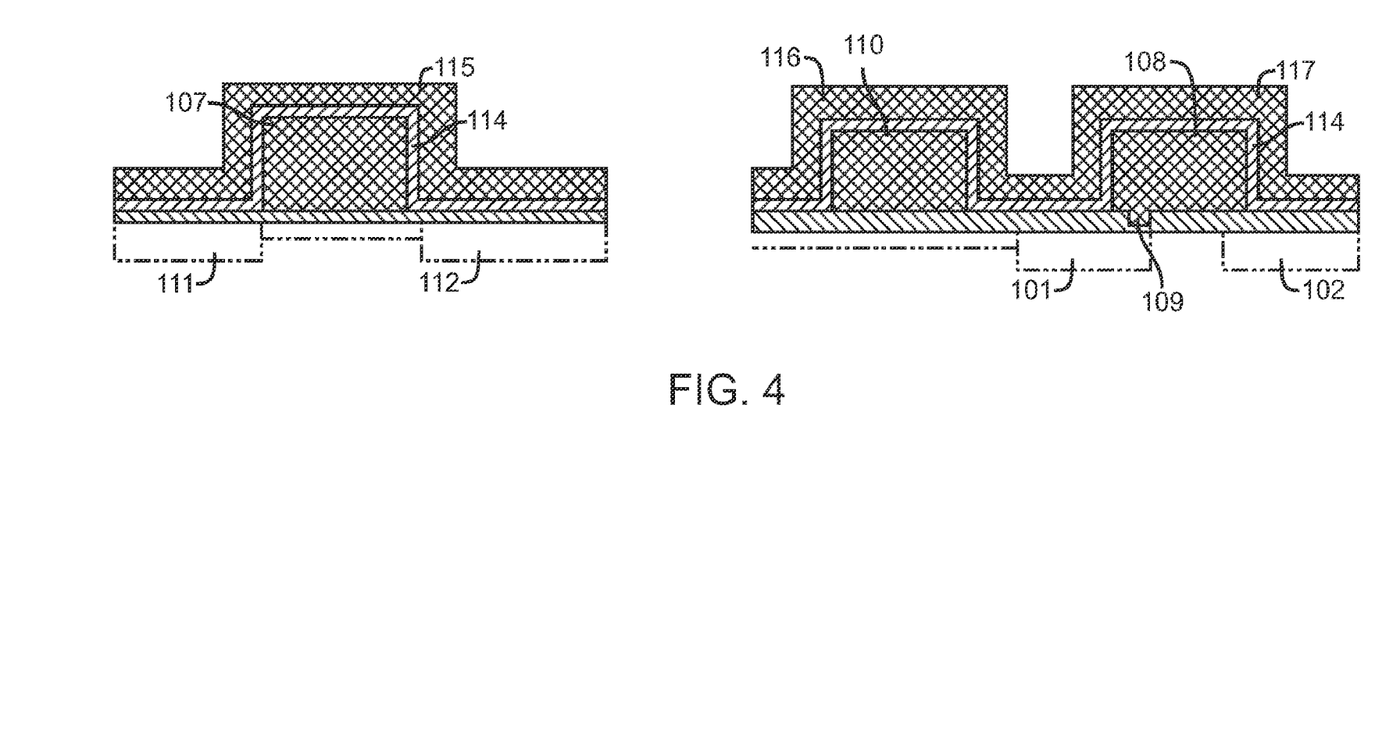

Referring to FIG. 4, the method includes forming a control gate 117 and a removable select gate 116 associated with the embedded EEPROM, and a control gate 115 associated with the OTP EPROM overlying the insulating layer using a second polysilicon layer. The second polysilicon is often doped after deposition with a dopant such as phosphorus at a dosage ranging from $10^{19}$ to $10^{21}$ atom/cm$^3$. Depending on the application, other dopant materials such as boron or arsenic or antimony may also be used. The second polysilicon may also be in situ doped during deposition. In certain embodiment, the second polysilicon may also contain a WSix cap. Like reference numerals are used in FIG. 4 as some of the other Figures herein.

Figure 5:
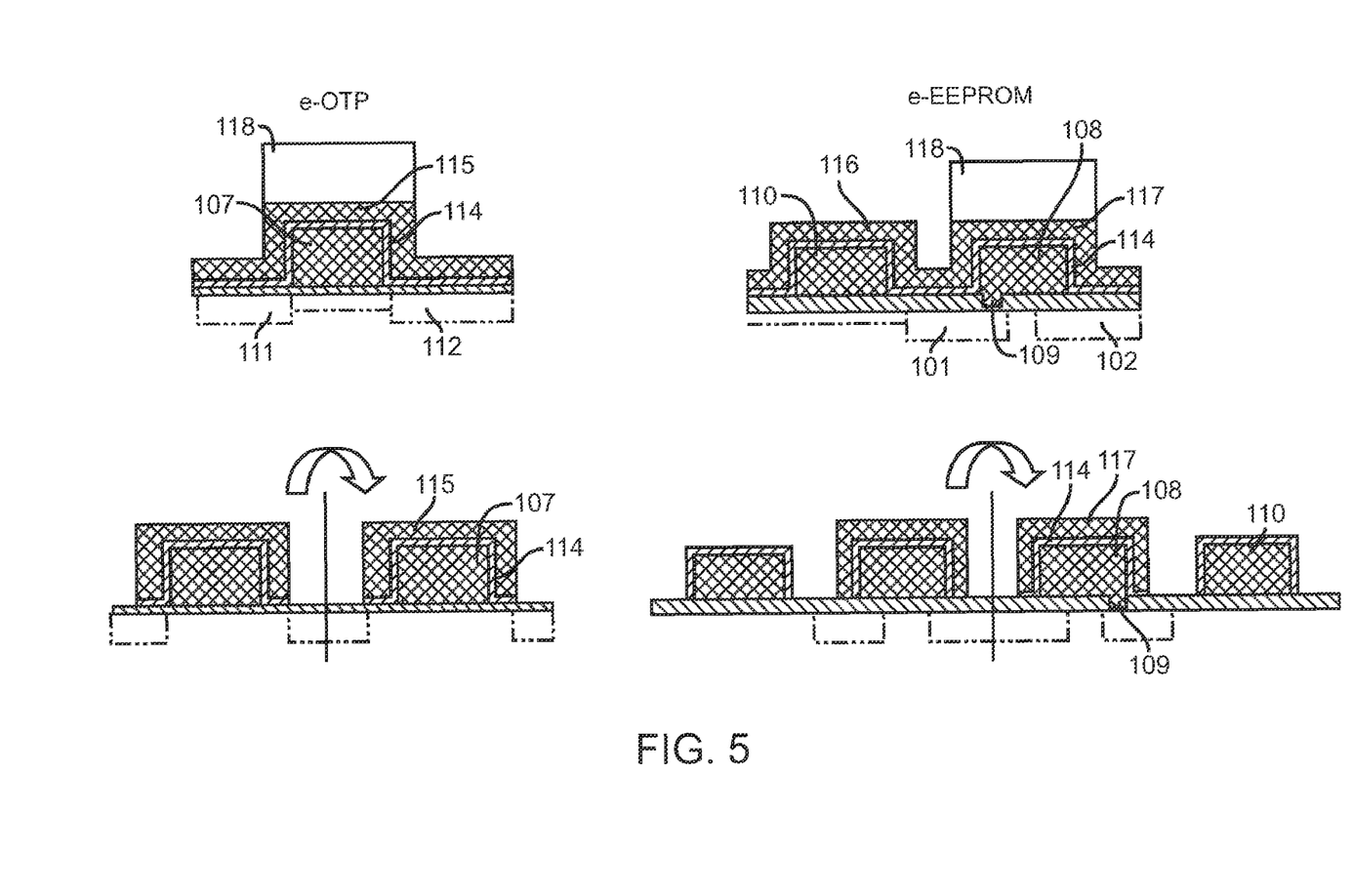

Referring to FIG. 5, the removable select gate is removed by selectively etching of the second polysilicon layer by applying a patterned mask 118 overlying an embedded EEPROM control gate and a OTP-EPROM control gate. Preferably, the patterned mask is a photoresist material. Other patterning materials such as a hard mask or a silicon oxide or a silicon nitride may also be used. Like reference numerals are used in FIG. 5 as some of the other Figures herein.

Figure 6:
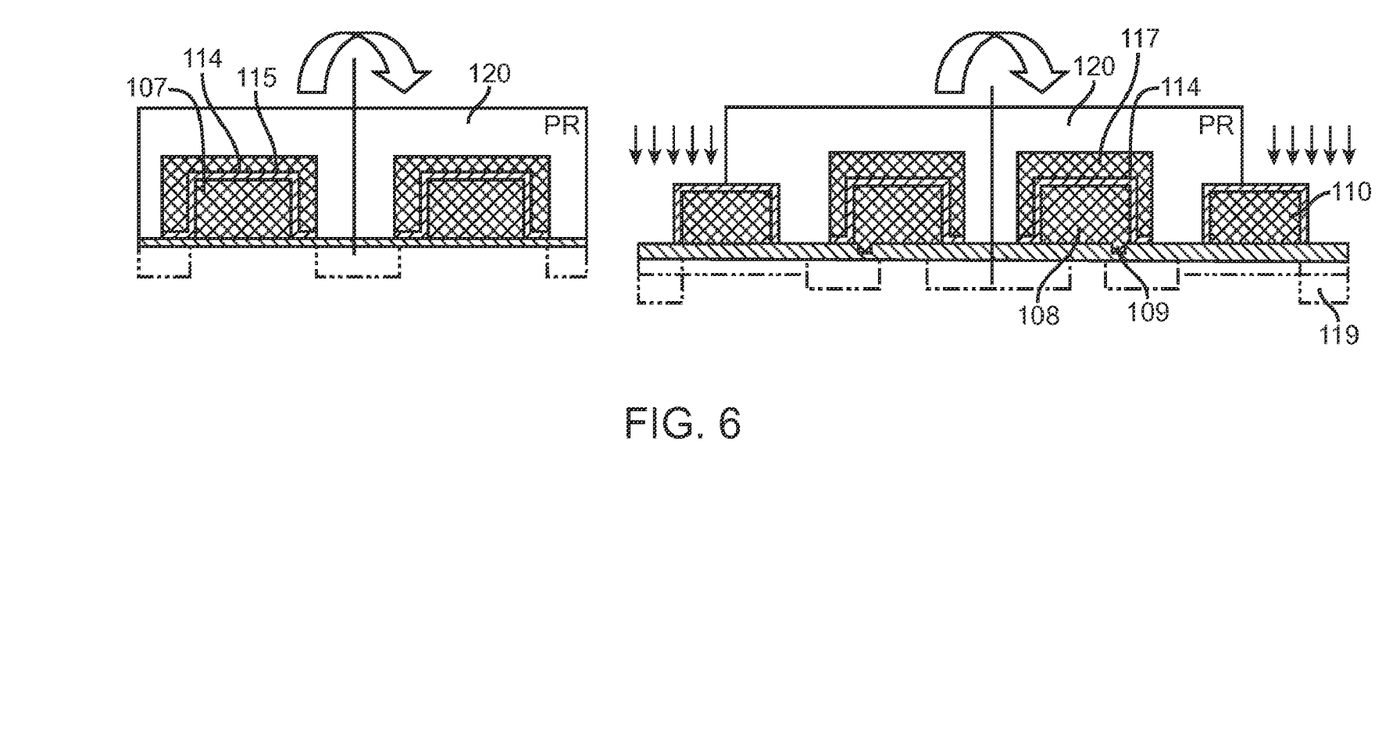

The method continues with implantation of a select gate double diffusion drain region 119 as illustrated in FIG. 6. A photomask 120 is formed overlying a OTP-EPROM cell structure and a portion of an embedded EEPROM cell structure while a select gate drain region 119 is exposed. The implant is performed using more than one impurities. In a specific embodiment, two impurities, phosphorus and arsenic are used. The phosphorus implant is often provided using a dose ranging from $1\times10^{14}$ to $1\times10^{15}$ atoms cm$^{-3}$ and arsenic implant is often provided using a dose of about $5\times10^{15}$ atoms cm$^{-3}$. The implant is often performed at an angle of 55 degree to 65 degree to normal. Other implant parameters may also be used depending on the application. Like reference numerals are used in FIG. 6 as some of the other Figures herein.

Figure 7:
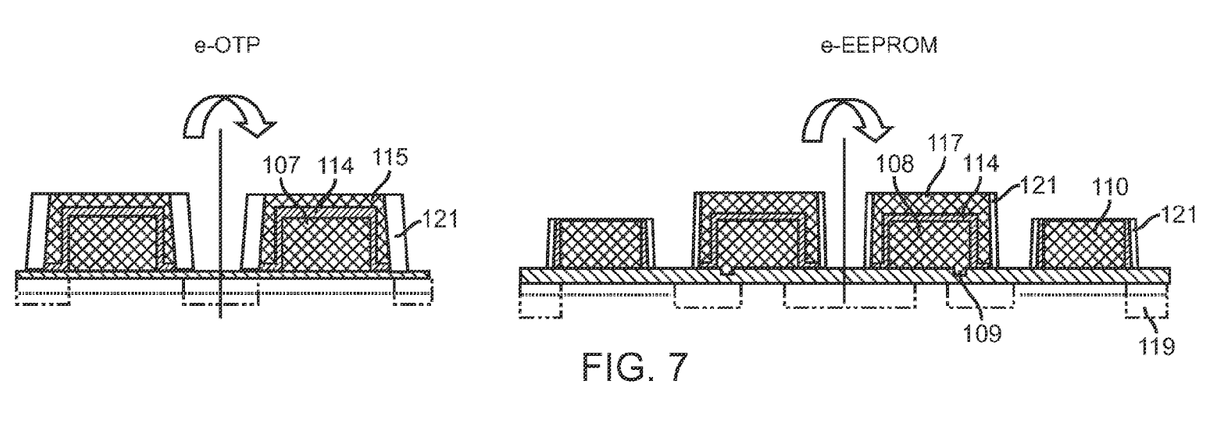

As shown in FIG. 7, spacers 121 are formed on vertical walls of a OTP-EPROM gate structure, an embedded EEPROM gate structure and a select gate. Spacer material is often a silicon oxide deposited by decomposition of TEOS (tetraethyl orthosilicate). Other forms of deposition method such as chemical vapor deposition (CVD) of suitable precursors may also be used. Other materials such as a silicon nitride or a combination of a silicon oxide and a silicon nitride may also used. Like reference numerals are used in FIG. 7 as some of the other Figures herein.

Figure 8:
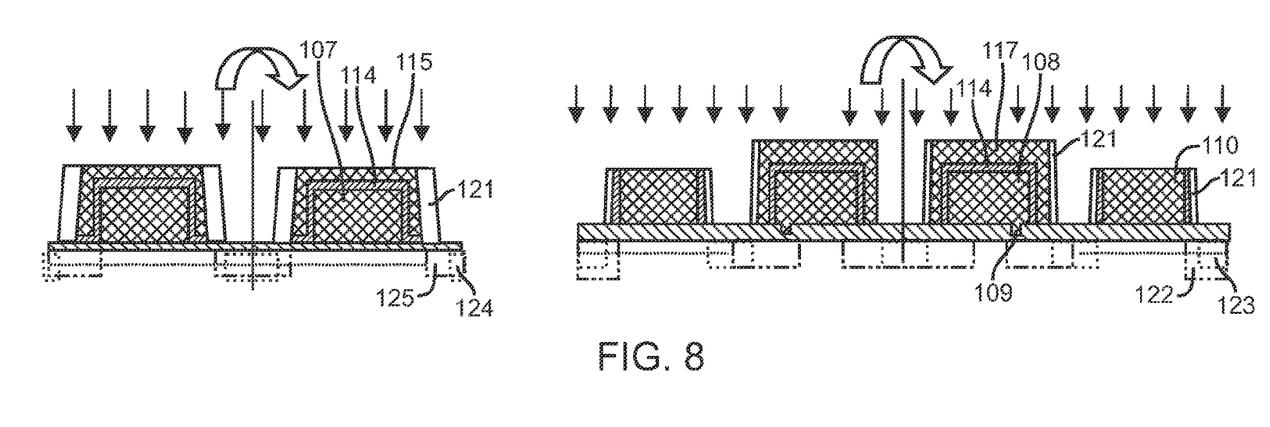

FIG. 8 illustrates the formation of a plurality of contact regions. The method includes implanting OTP-EPROM source/drain regions, embedded EEPROM source/drain regions, and select gate source/drain region. The respective gates and the spacer are used as masks resulting in a two region drain structure. The two region drain structure comprises of a lightly doped drain (LDD) 122 and a more heavily doped drain 123 associated with the select gate. The OTP-EPROM source/drain structure also comprises of a lightly doped drain (LDD) 125 and a more heavily doped drain 124. The implant is performed using a suitable impurity such as phosphorus or arsenic. The implant is often provided using a dose ranging from $1.5\times10^{14}$ to $1.5\times10^{16}$ atom/cm$^3$. Implant energy is often provided at 60 to 100 keV. The implant is often performed at an angle of 0 to normal. Other implant parameters may also be used depending on the application. Like reference numerals are used in FIG. 8 as some of the other Figures herein.

Figure 9:
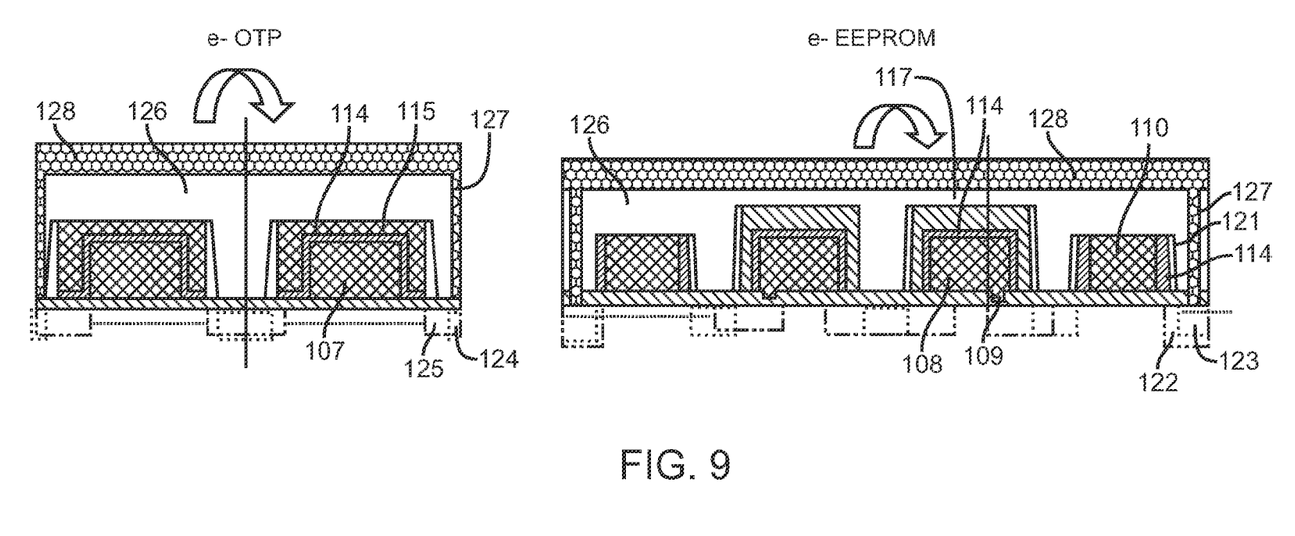

Referring to FIG. 9, the method also includes forming a dielectric layer 126 overlying the OTP EPROM gate structure, the embedded EEPROM gate structure and the select gate. The dielectric layer comprises of a boron and phosphorus doped silicon oxide. As merely an example, a silicon oxide formed by decomposition of tetraethyl orthosilicate and doped with boron and phosphorus (BP-TEOS) can be used. Other suitable dielectric material such as phosphorus doped silicon oxide formed by a high density plasma process may also be used. The dielectric layer is planarized using chemical mechanical polishing (CMP) process. Alternatively, the dielectric layer can also be planarized using a combination of a reflow and etch process. The method includes forming contact regions in the dielectric layer by a patterning and etching process. A metal layer is formed overlying the contact regions 127 and the dielectric layer 128. Like reference numerals are used in FIG. 9 as some of the other Figures herein.

The process then completes with conventional process steps such as interlayer dielectric (ILD) deposition and planarization, and metallization among others.

Figure 10:
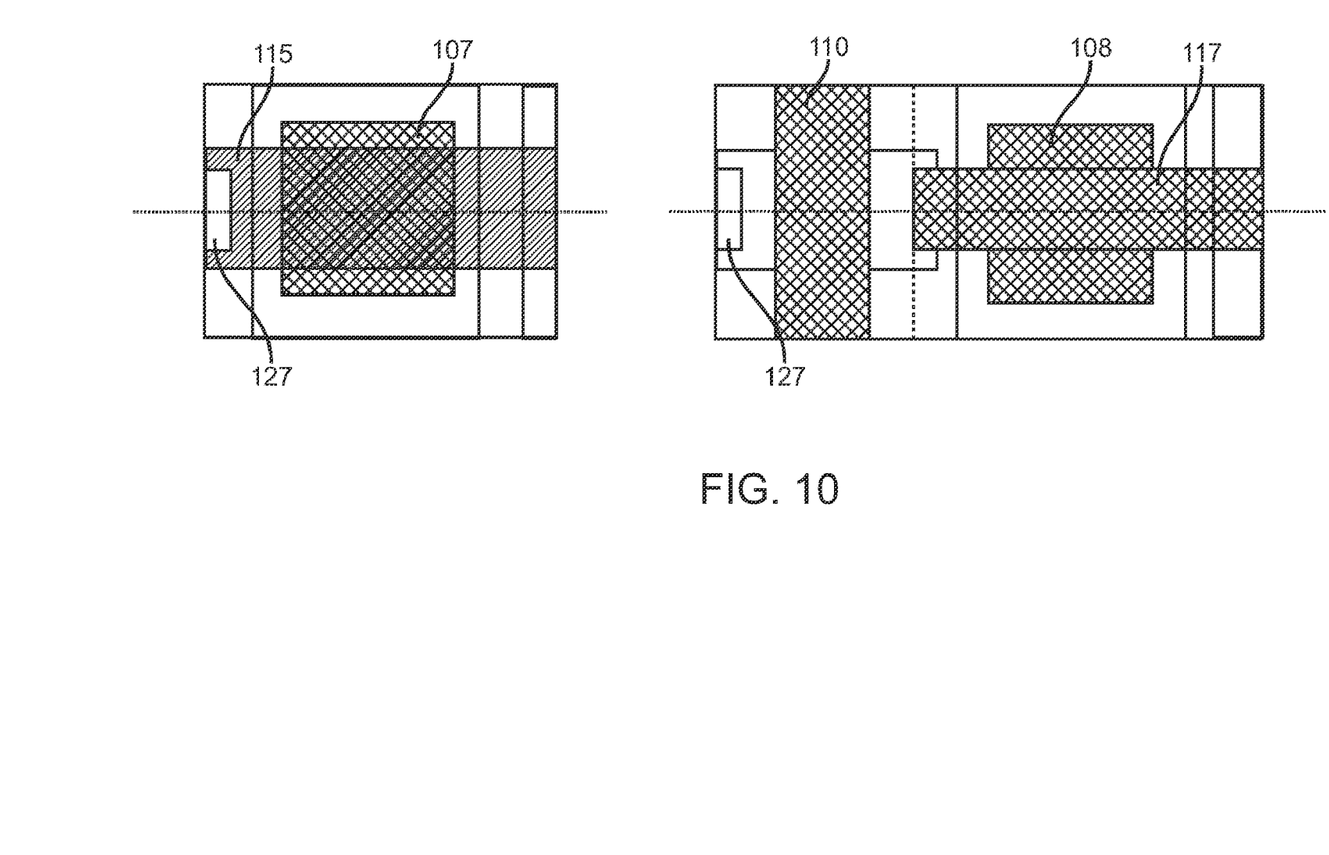
FIG. 10 is a simplified top view of an OTP EPROM gate structure and an embedded EEPROM gate structure according to embodiments of present invention.

FIG. 10 shows a simplified top view of an OTP EPROM gate structure and an embedded EEPROM gate structure. As shown, the OTP EPROM has a control gate 115 overlying a first gate 107. A contact region 127 is shown. A control gate 117 overlying floating gate 108 associated with the EEPROM and a select gate 110 are also shown. Like reference numerals are used in FIG. 10 as some of the other Figures herein.

Figure 11:
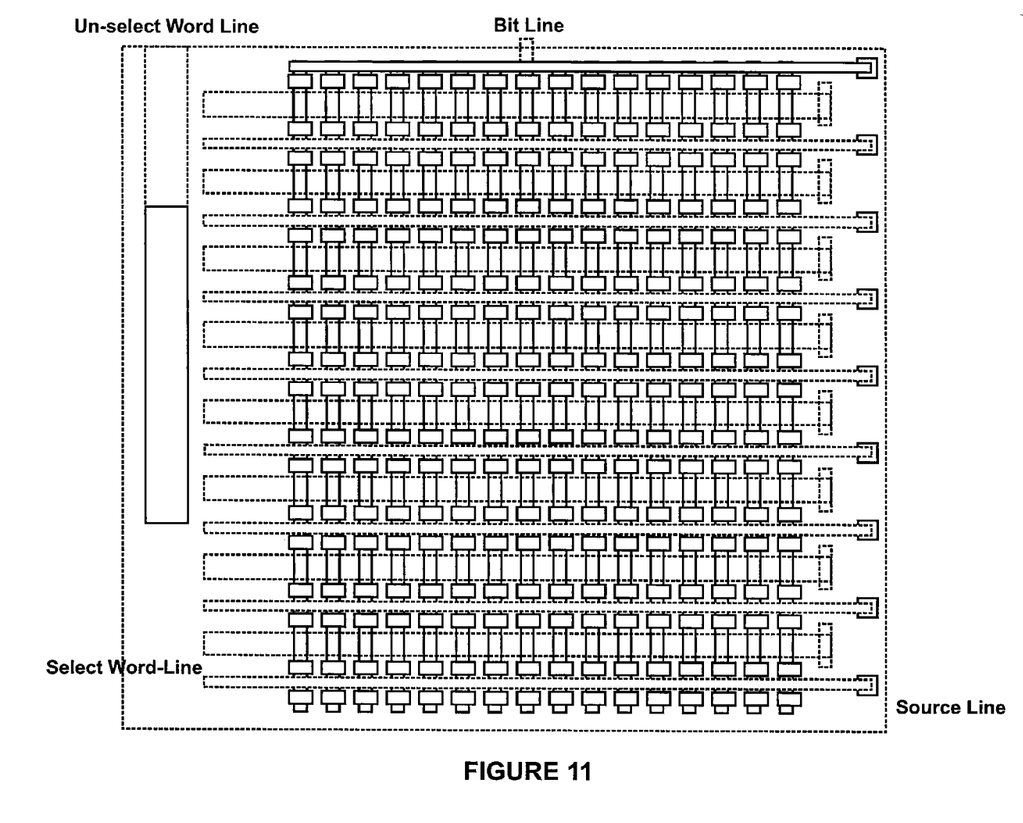
FIG. 11 is a simplified layout of OTP EPROM and embedded EEPROM array according to embodiments of present invention.

FIG. 11 is a simplified cell array structure according to an embodiment of the present invention. The figure shows selected word line and unselected word line configurations. A source line and a bit line are also shown.

Figure 12:
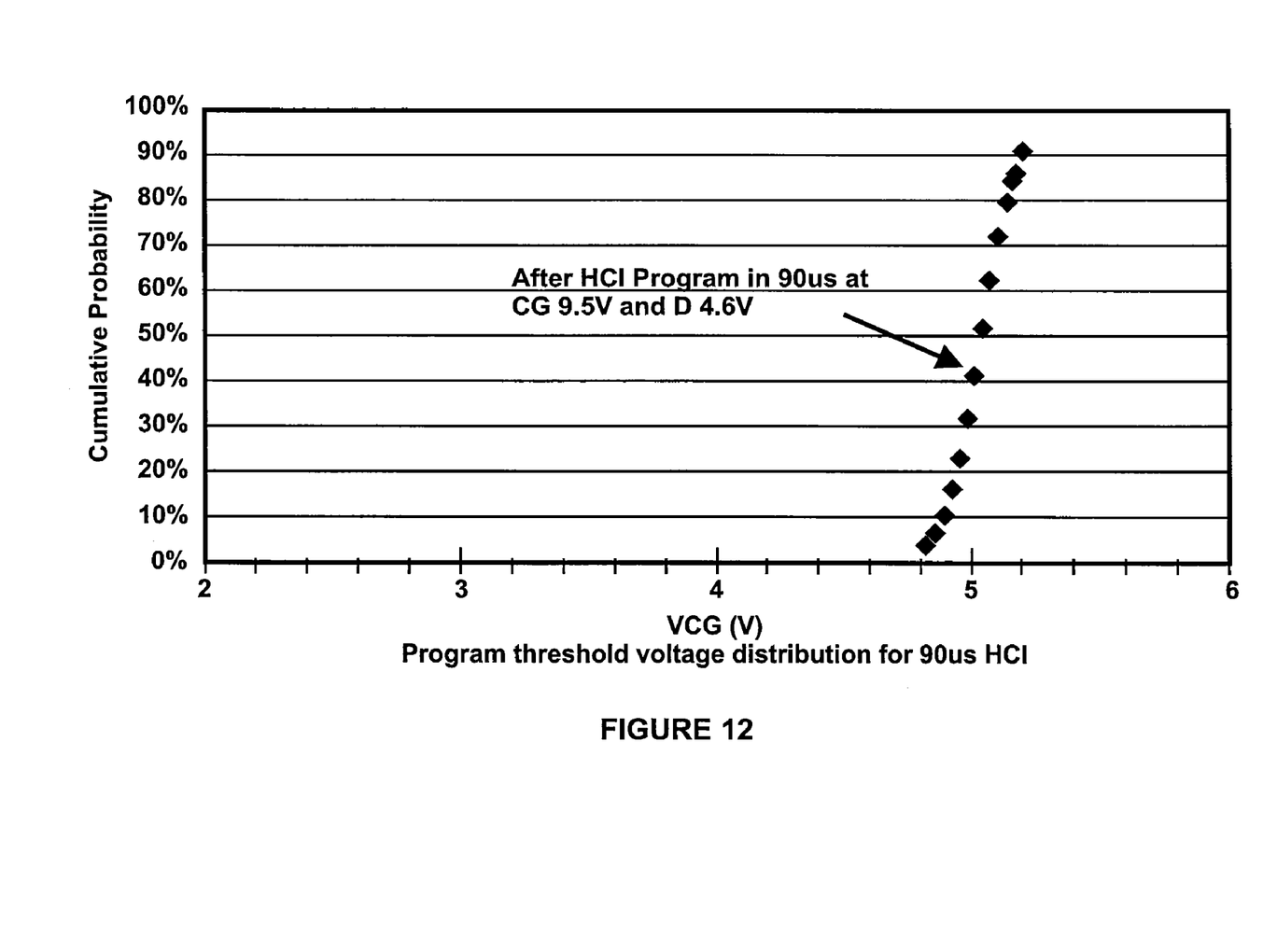
FIG. 12 shows simplified program threshold voltage distribution for a 90 us hot carrier injection (HCI) according to embodiments of the present invention.

FIG. 12 shows a simplified program threshold voltage distribution for a hot carrier injection (HCI) program. The horizontal axis illustrates control gate voltage (VCG) in volts. The vertical axis illustrates cumulative probability of VCG. The HCI program illustrated in FIG. 12 is performed at a control gate voltage (VCG) of 9.5 volts, a drain voltage (VD) of 4.6 volts, and a pulse width of 90 μs. As shown in FIG. 12, the threshold voltage after the HCI program shows a uniform VCG of greater than 4.5 volts.

Figure 13:
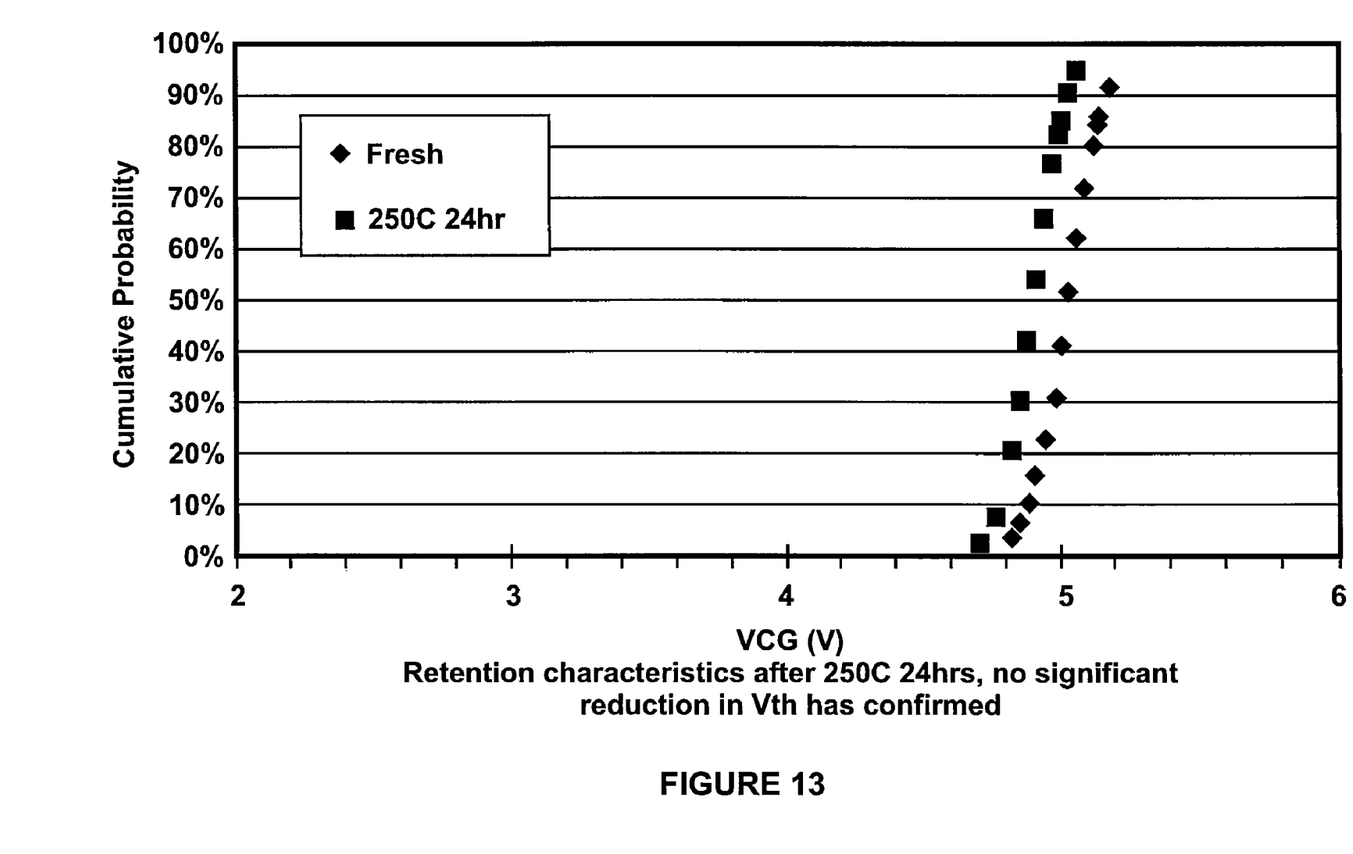
FIG. 13 shows simplified retention characteristics after 24 hours of thermal treatment at 250 Celsius.

FIG. 13 shows a simplified retention characteristics after a thermal treatment for 24 hours at 250 C. The graph illustrates a plot of cumulative probability of VCG on the vertical axis versus VCG in volts on the horizontal axis. No significant threshold voltage (Vth) reduction was observed.

Figure 14:
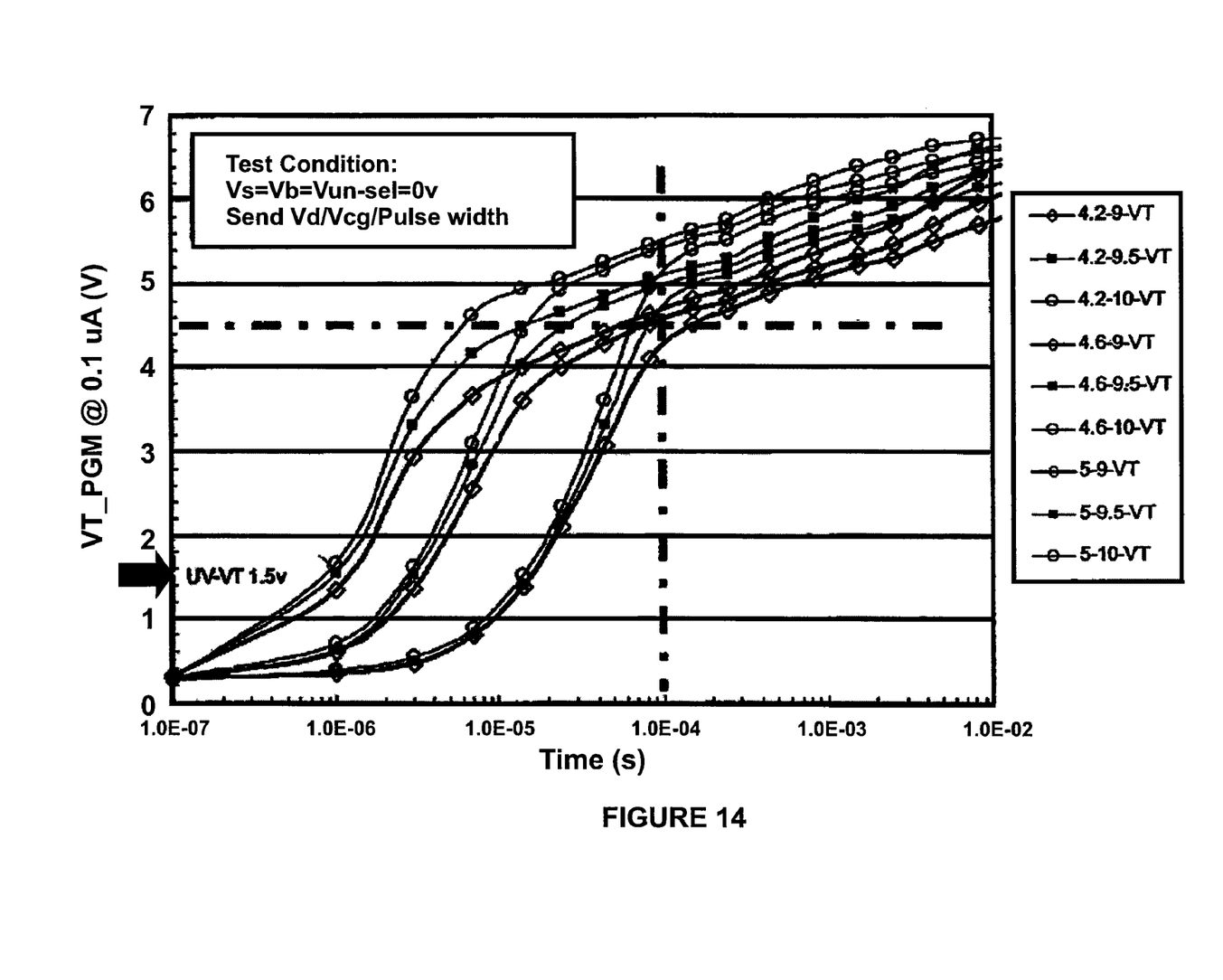
FIG. 14 shows simplified program characteristics for different $V_D$ and $V_{CG}$.

FIG. 14 shows a simplified program characteristics under different test conditions of $V_D$ and $V_{CG}$ pair. The vertical axis illustrates the threshold voltage measured at a drain current of 0.1 μA (VT_PRM@0.1 μA) after being programmed. The horizontal axis illustrates pulse width in seconds. As shown in FIG. 14, several pairs of VD and VCG are used at different pulse widths to select the program used to obtain FIG. 12. The lowest VD and VCG pair are selected to achieve a VT_PRM greater than 4.5 volts for the HCI programming.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a OTP-EPROM device structure in an embedded EEPROM array comprising:
   providing a substrate including a surface region;
   providing a first cell region and a second cell region within the surface region of the substrate;
   forming a gate dielectric layer of a first thickness overlying the surface region of the substrate;
   forming a tunnel oxide window in a portion of the gate dielectric in the second cell region, the tunnel oxide window has a second thickness, the second thickness is less than the first thickness;
   forming a first OTP EPROM gate overlying the gate dielectric in the first cell region, an EEPROM floating gate and a select gate overlying the gate dielectric in the second cell region using a first polysilicon layer;
   forming a patterned mask overlying the second cell region associated with the EEPROM and exposing the first cell region associated with the OTP EPROM;
   forming an OTP EPROM source region and an OTP EPROM drain region in a portion of the substrate in the first cell region;
   forming an insulating layer overlying the first OTP EPROM gate, the EEPROM floating gate and the select gate;
   forming an OTP EPROM control gate, an EEPROM control gate and a removable second select gate overlying the insulating layer using a second polysilicon layer;
   removing the removable second select gate;
   forming a dielectric layer overlying the OTP EPROM gate structure, the EEPROM gate structure and the select gate;
   planarizing the dielectric layer;
   forming contact regions in the dielectric layer;
   forming a metal layer overlying the dielectric layer and the contact regions;
   wherein the OTP EPROM source region and the OTP EPROM drain region are provided by masking the second cell region associated with the EEPROM while exposing the first cell region associated with the OTP EPROM.

2. The method of claim 1 wherein the substrate is a semiconductor wafer.

3. The method of claim 1 wherein the gate dielectric has a thickness range of 70 to 100 Angstroms.

4. The method of claim 1 wherein the OTP source region and the OTP drain region are provides by implantation using arsenic, at an energy ranging from 10 to 60 keV and a dose ranging from $1 \times 10^{15}$ to $5 \times 10^{15}$ atoms/cm$^3$.

5. The method of claim 1 wherein the patterning mask is a photoresist material.

6. The method of claim 1 wherein the first polysilicon layer is in situ doped with phosphorus at a dosage ranging from $10^{19}$ to $10^{21}$ atoms/cm$^3$.

7. The method of claim 1 wherein the insulating layer comprises of an ONO structure.

8. The method of claim 1 wherein the second polysilicon layer is in situ doped with phosphorus at a dosage ranging from $10^{19}$ to $10^{21}$ atom/cm$^3$.

9. The method of claim 1 wherein the dielectric layer comprises of boron and phosphorus doped oxide formed by decomposition of tetraethyl orthosilicate and doped with boron and phosphorus (BP-TEOS).

10. The method of claim 1 wherein the contact region is provided by a patterning and etching process.

11. The method of claim 1 wherein the dielectric layer is planarized using chemical mechanical polishing (CMP).

12. The method of claim 1 wherein forming a tunnel oxide window in a portion of the gate dielectric in the second cell region comprises reducing a thickness of the gate dielectric layer from the first thickness to the second thickness in a selected region of the second cell region.

13. The method of claim 12 further comprising reducing a thickness of a portion of the gate dielectric in the first cell region from the first thickness to the second thickness.

14. The method of claim 13 wherein a single dielectric etching process is used to reduce the thickness of the gate dielectric layer in the first cell region and the second cell region.

\* \* \* \* \*